United States Patent
Senior et al.

(10) Patent No.: US 10,535,912 B2
(45) Date of Patent: Jan. 14, 2020

(54) WIDEBAND GYSEL POWER DIVIDER

(71) Applicant: Anaren, Inc., East Syracuse, NY (US)

(72) Inventors: David Senior, Chittenango, NY (US); Chong Mei, Jamesville, NY (US)

(73) Assignee: Anaren, Inc., East Syracuse, NY (US)

( * ) Notice: Subject to any disclaimer, the term of this patent is extended or adjusted under 35 U.S.C. 154(b) by 0 days.

(21) Appl. No.: 15/672,611

(22) Filed: Aug. 9, 2017

(65) Prior Publication Data
US 2019/0051964 A1  Feb. 14, 2019

(51) Int. Cl.
| | | |
|---|---|---|
| H01P 5/04 | (2006.01) | |
| H01P 5/10 | (2006.01) | |
| H01P 5/16 | (2006.01) | |
| H01P 5/18 | (2006.01) | |
| H03H 7/48 | (2006.01) | |
| H05K 1/02 | (2006.01) | |

(52) U.S. Cl.
CPC .............. *H01P 5/1007* (2013.01); *H01P 5/04* (2013.01); *H01P 5/16* (2013.01); *H03H 7/48* (2013.01); *H05K 1/0237* (2013.01)

(58) Field of Classification Search
CPC . H01P 5/1007; H01P 5/04; H01P 5/16; H03H 7/48; H05K 1/0237
USPC ....................................................... 333/104
See application file for complete search history.

(56) References Cited

U.S. PATENT DOCUMENTS

| | | | |
|---|---|---|---|
| 4,721,929 | A | 1/1988 | Schnetzer |
| 4,774,481 | A | 9/1988 | Edwards et al. |
| 5,410,281 | A | 4/1995 | Blum |
| 2008/0018412 | A1 | 1/2008 | Podell |

OTHER PUBLICATIONS

Jiao et al , A novel impedance transforming coupled line power divider combining Wilkinson and Gysel structures, 2016 , IEEE International Workshop, pp. 1-3.*

* cited by examiner

*Primary Examiner* — Robert J Pascal
*Assistant Examiner* — Kimberly E Glenn
(74) *Attorney, Agent, or Firm* — Polsinelli PC (57) ABSTRACT

A power divider capable of implementation in a compact multilayer surface mount component to perform power division/combining with low insertion loss, wide bandwidth, design flexibility and high power handling capabilities. The power divider has a first pair of coupled transmission lines interconnecting the input to the outputs, a second pair of coupled transmission lines interconnecting the output ports to grounded isolation resistors, and a single transmission line interconnecting the second pair of coupled transmission lines. The surface mount implementation is by a first layer supporting the ports, a second layer providing edge coupled lines, a third layer having ground plane, a fourth layer and a fifth layer each supporting one of a pair of broadside coupled lines, a sixth layer with another ground plane, and a seventh layer including a single line interconnecting the broadside coupled lines.

17 Claims, 9 Drawing Sheets

WIDEBAND GYSEL POWER DIVIDER

BACKGROUND OF THE INVENTION

1. Field of the Invention

The present invention relates to power dividers/combiners and, more specifically, to a surface mount power divider/combiner for wide bandwidth and high power applications.

2. Description of the Related Art

Power dividers and combiners are fundamentals passive devices in microwave engineering. Wireless systems greatly rely on power splitting/combining tasks to achieve target performance for many different applications, such as high power amplifiers, phased arrays antennas, oscillators, mixers and modulators. Wilkinson and the Gysel power dividers are popular choices for power division with equal phase at the output ports, with the Gysel architecture being more useful in high power applications.

A Wilkinson power divider uses quarter-wave transformers to match the output ports to the common port. An isolation resistor of value 2 Zo is added between the output ports, which imposes limitations for frequency operation, power handling and size. The main disadvantage of this approach is that it is incapable of achieving high bandwidth with higher isolation. In order to expand the bandwidth, additional quarter-wave transmission line sections can be used. However, this solution is larger, adds insertion loss, and requires more isolation resistors, which can be difficult to get in the market for broadband operation. Moreover, the Wilkinson power divider is not the best choice when high power is required because there is no way to dissipate the heat produced in the isolation resistors, which in addition, are not directly connected to any heat sink.

A Gysel power divider offers a different topology that uses two external grounded isolation loads. This topology provides an advantage because the heat produced by these loads is directly transferred out to the heat sink so that the Gysel power divider is capable of handling a high power continuous wave. In addition, different values of the isolation loads in a Gysel power divider with respect to $Z_0$ can be used to control the bandwidth, and these loads can be high-power and broadband. The loads can be external or internal to the power splitter and any length of transmission line can be added for the connection. However, Gysel power divider also suffers from narrow bandwidth, but it is more controllable without using additional sections.

With wireless systems requiring wider bandwidth coverage, higher power capabilities, lower insertion loss, and compact size devices, designers have increased challenges to achieve the design performance with the available board space. Thus, there is a need in the art for a power divider that is implemented in a compact multilayer surface mount component and has low insertion loss, wide bandwidth, design flexibility and high power handling capabilities.

BRIEF SUMMARY OF THE INVENTION

The present invention provides a modified Gysel power divider in a compact multilayer surface mount component that can perform power division/combining with low insertion loss, wide bandwidth, design flexibility and high power handling capabilities. In one embodiment, the power divider comprises a first port, a first pair of coupled transmission lines interconnected to the first port, a second port coupled to one of the first pair of coupled transmission lines, a third port coupled to the other of the first pair of coupled transmission lines, a second pair of coupled transmission lines interconnected by a long transmission line, wherein each of the pair of coupled transmission lines is connected to a grounded isolation resistor that can be external or internal to the device and wherein one of the second pair of coupled transmission lines is connected to the second port and the other of the second pair of coupled transmission lines is connected to the third port. The first pair of coupled transmission lines is characterized by the even and odd mode impedances, which are given by the needed level of coupling. The first pair of coupled transmission lines has an equivalent electrical length of 90 degrees. The second pair of coupled transmission lines is also characterized by the even and odd mode impedances, which are given by the needed level of coupling. The second pair of coupled transmission lines has an equivalent electrical length of 90 degrees. The long transmission line provides a 180 degree phase shift.

The present invention also involves a surface mount power divider that is made from a first layer including a first port, a second port, a third port, and a ground patch, a second layer including a first via connected to the first port, a second via connected to the second port, and a third via connected to the third port, wherein said second layer further includes a pair of edge coupled lines, wherein one of the pair of edge coupled lines connects the first via to the second via and the other of the edge coupled lines connects the first via to the third via, a third layer including a first ground plane associated with the pair of edge coupled lines, a fourth layer including one of a pair of broadside coupled lines, a fifth layer includes the other of a pair of broadside coupled lines, a sixth layer including a second ground plane associated with the pair of broadside coupled lines, and a seventh layer including a single line interconnecting the pair of broadside coupled lines. The first pair of coupled transmission lines is characterized by the even and odd mode impedances, which are given by the needed level of coupling. The pair of edge coupled lines has an equivalent electrical length of 90 degrees. The second pair of coupled transmission lines is characterized by the even and odd mode impedances, which are given by the needed level of coupling. The surface mount power divider of claim 10, wherein the pair of broadside coupled transmission lines has a length of 90 degrees.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
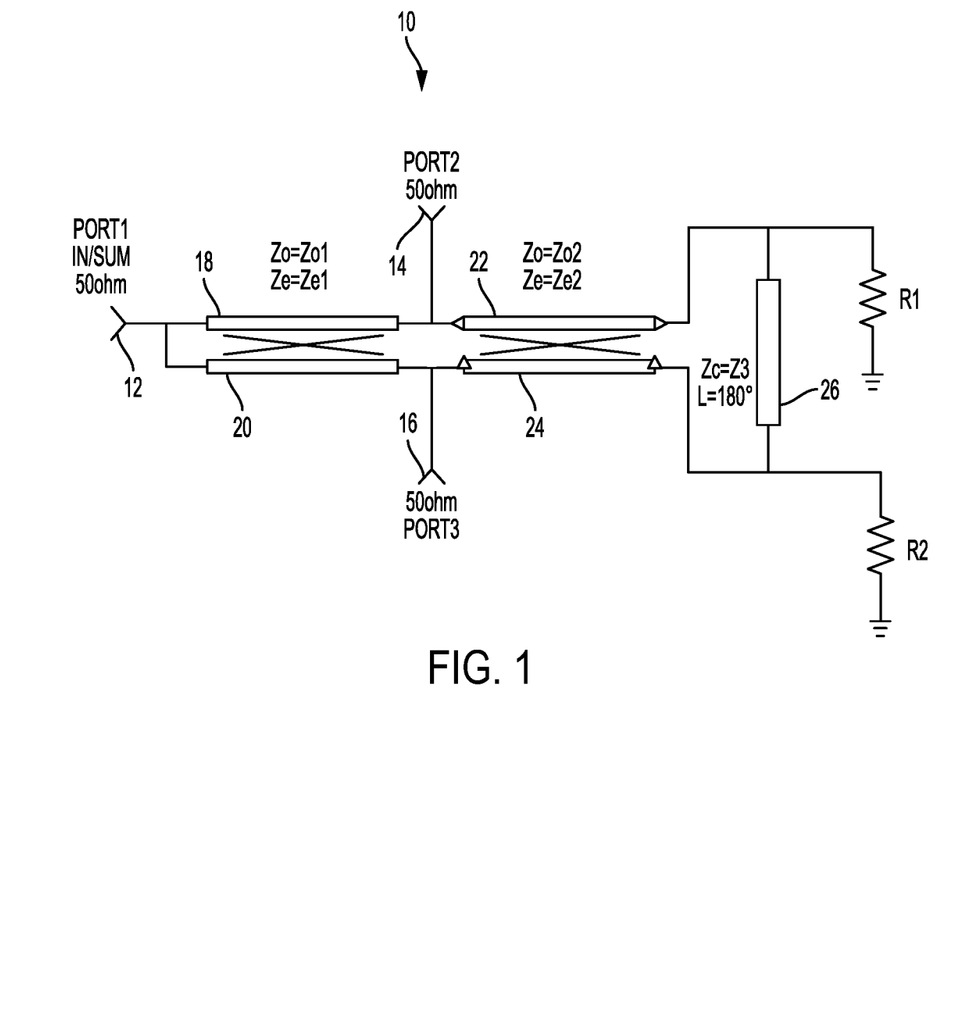
FIG. 1 is a schematic of a power divider/combiner according to the present invention.

Referring to the figures, wherein like numerals refer to like parts throughout, there is seen in FIG. 1 a schematic of a power divider 10 according to the present invention. Power divider 10 comprises a first port 12 coupled to a second port 14 and a third port 16 via a first set of coupled transmission lines 18 and 20. Second port 14 and third port 16 are further connected to a pair of directly grounded isolation resistors R1 and R2 via a second set of coupled transmission lines 22 and 24. A long transmission line 26 extends between second set of coupled transmission lines 22 and 24. First port 12 is shown as functioning an input port, while second port 14 and third port 16 function as output ports for power dividing. It should be recognized that power divider 10 could be used as a combiner by using second port 14 and third port 16 as inputs, and first port 12 as an output.

Coupled transmission lines 18 and 20 have the parameters $Ze_1$, $Zo_1$, $\theta_1$ and coupled transmission lines 22 and 24 have the parameters $Ze_2$, $Zo_2$, $\theta_2$, with $Ze_i$ and $Zo_i$ being the even and odd mode impedances of the coupled lines and $\theta_i$ the required electrical length. Coupled transmission lines 18 and 20 in conjunction with coupled transmission lines 22 and 24 achieve a broader bandwidth while reducing the overall size of the device without using additional coupled sections. Transmission lines may be single transmission lines, a combination of transmission lines with tight and loose coupling sections, or lumped elements that provide the coupling and the appropriate equivalent electrical length of 90 degrees. The loads provided by resistors R1 and R2 may be varied to control the bandwidth of power divider 10.

To demonstrate performance, a conventional two-way power divider was compared against power divider 10 according to the present invention for a normalized operation at a center frequency of 1000 MHz. Ideal circuital simulations were performed to evaluate the performance of each relative to the other. Both the conventional Gysel layout and power divider of FIG. 1 were optimized to provide more than 20 dB isolation at the center frequency, while keeping a 20 dB return loss at the input and output ports. The isolation resistors R1 and R2 were kept at 50Ω.

Figure 2:
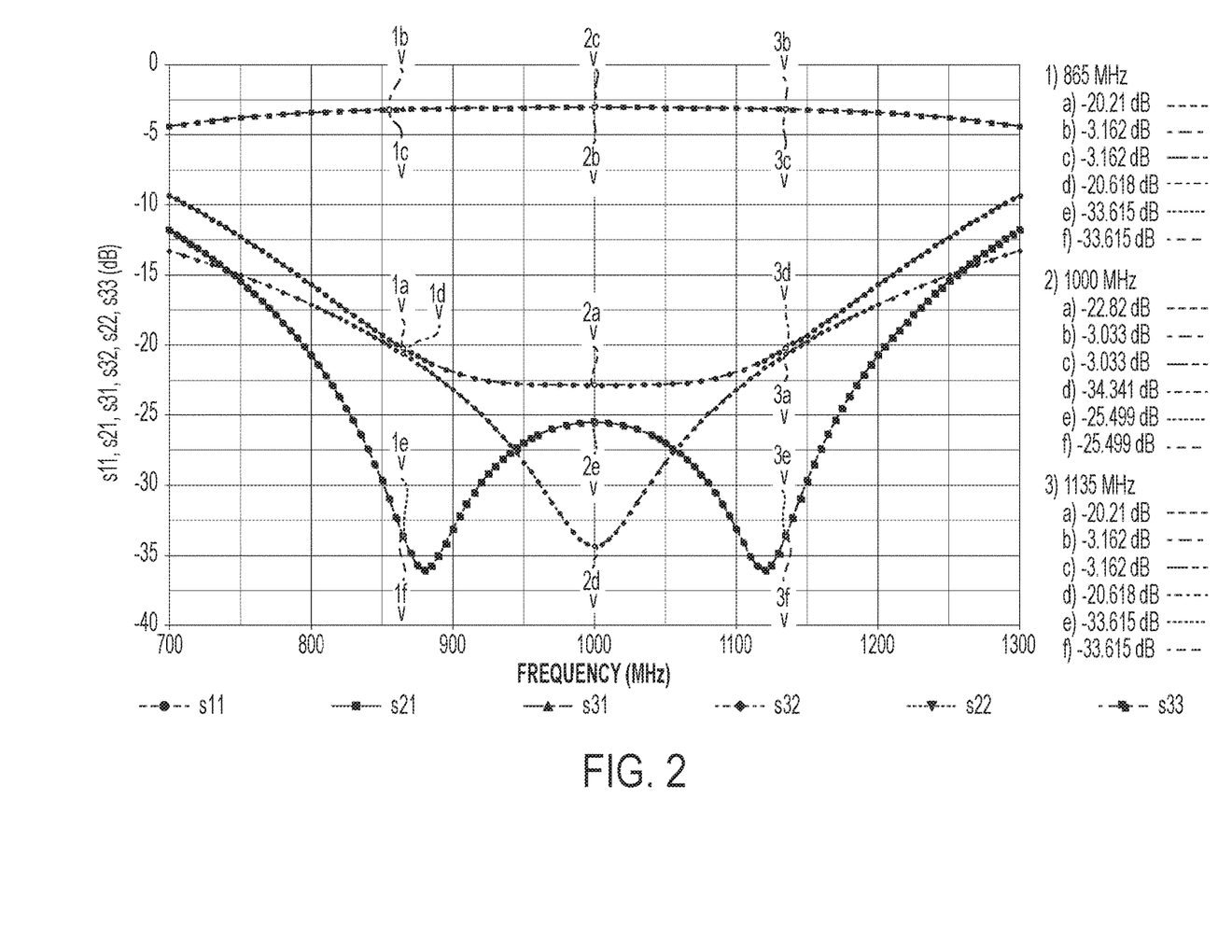
FIG. 2 is a graph of bandwidth loss in a conventional power divider/combiner.
Figure 3:
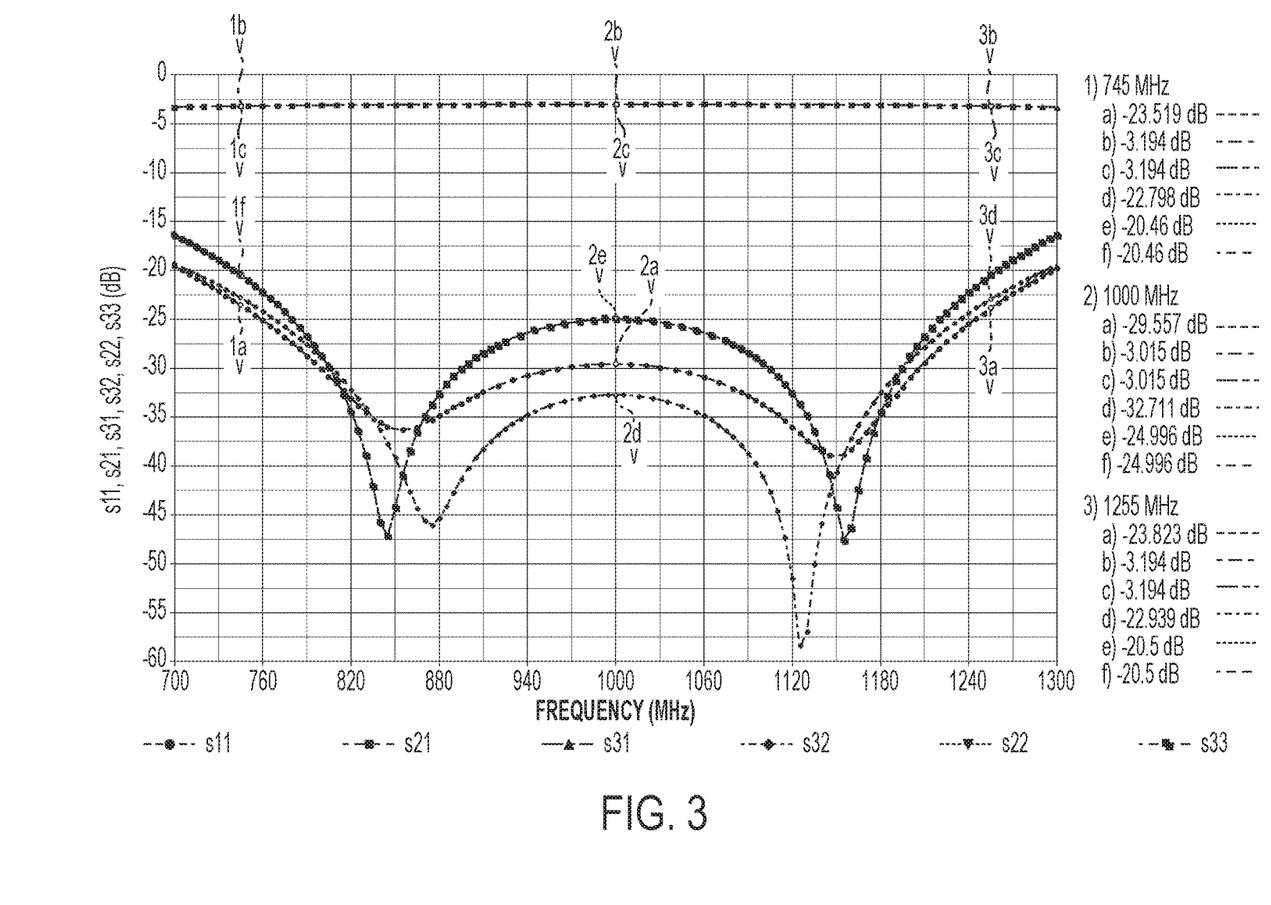
FIG. 3 is a graph of bandwidth loss in a power divider/combiner according to the present invention.

FIG. 2 shows that a 27 percent bandwidth (865 MHz-1135 MHz) for 20 dB isolation/return loss is achieved with a conventional Gysel power divider topology. Circuital parameters were Z1=65.77Ω, Z2=48.33Ω, Z3=34.45Ω. FIG. 3 shows the simulated S-parameters of the ideal circuit for the present invention. A 20 dB isolation and 20 dB return loss bandwidth of 51 percent was achieved while keeping lower insertion loss within the band. For this simulation, $Ze1$=68.4Ω, $Zo1$=50Ω, $Ze2$=115Ω, $Zo2$=46.18Ω, Z3=49.9Ω, $\theta1$=$\theta2$=$\theta3$=90°.

The present invention may be implemented using several approaches for a 20 dB isolation/return loss bandwidth. For example, conventional microstrip lines can provide a relatively straightforward implementation, but would result in a large device due to the need for in-plane implementation of all lines. For a miniaturized surface mount component, microstrip lines are not the best option due to the open structure that could be affected by the surrounding media. A multilayer implementation of power divider 10 on printed circuit board (PCB) technology may thus be used with a stripline as the waveguiding structure due to its excellent isolation capabilities, low radiation losses, and the enclosed implementation. With a stripline approach, any parasitic inductance at input and output ports can be rapidly compensated by using internal added capacitance.

Figure 4A:
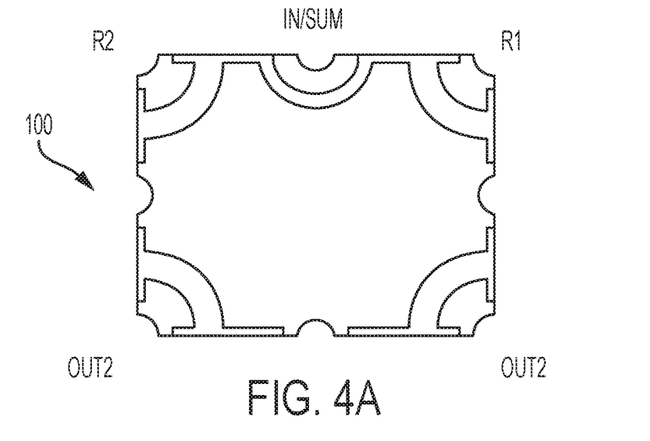
FIG. 4A is top plan of a surface mount embodiment of a power divider/combiner according to the present invention.
Figure 4B:
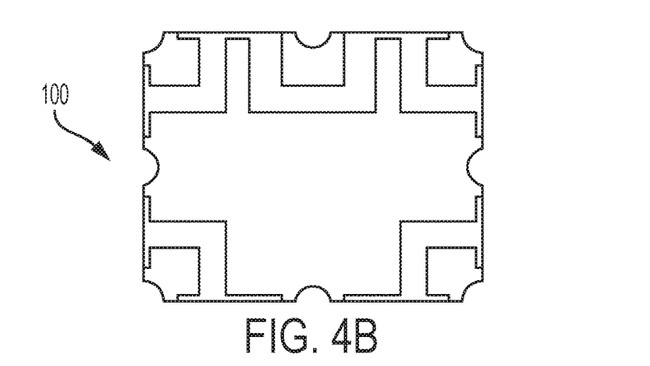
FIG. 4B is bottom plan of a surface mount embodiment of a power divider/combiner according to the present invention.
Figure 4C:
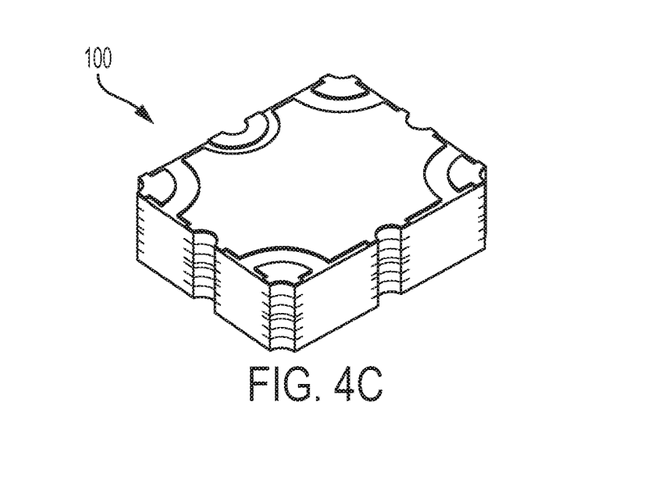
FIG. 4C is a perspective view of a surface mount embodiment of a power divider/combiner according to the present invention.
Figure 5:
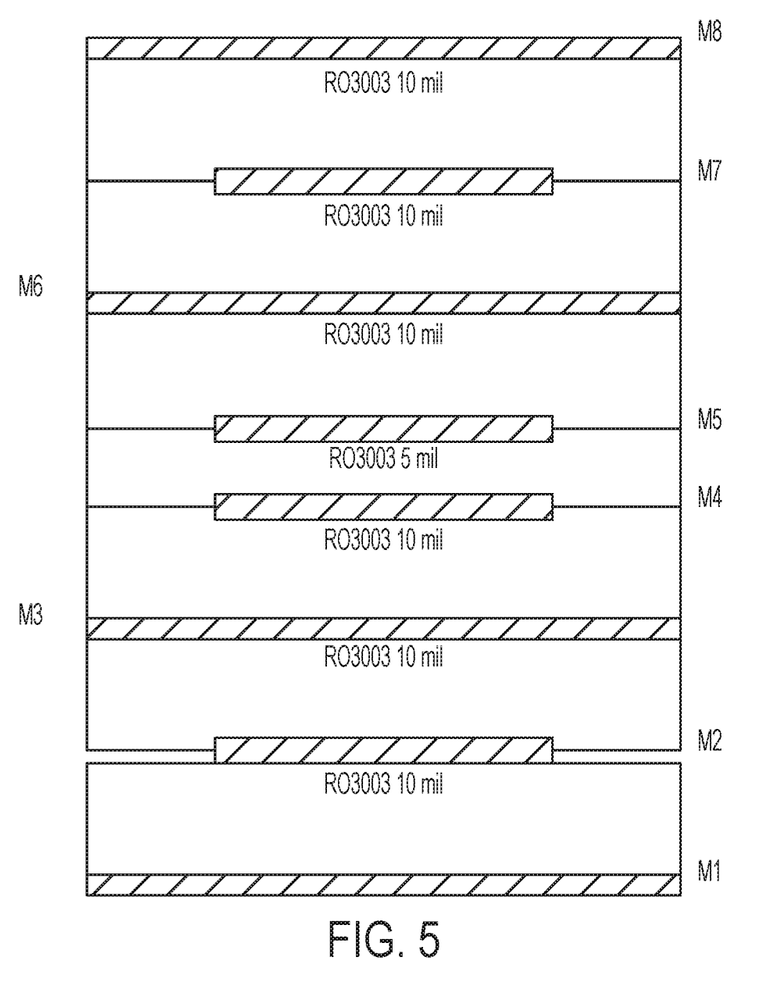
FIG. 5 is a schematic of a stackup for a surface mount embodiment of a power divider/combiner according to the present invention.
Figure 6:
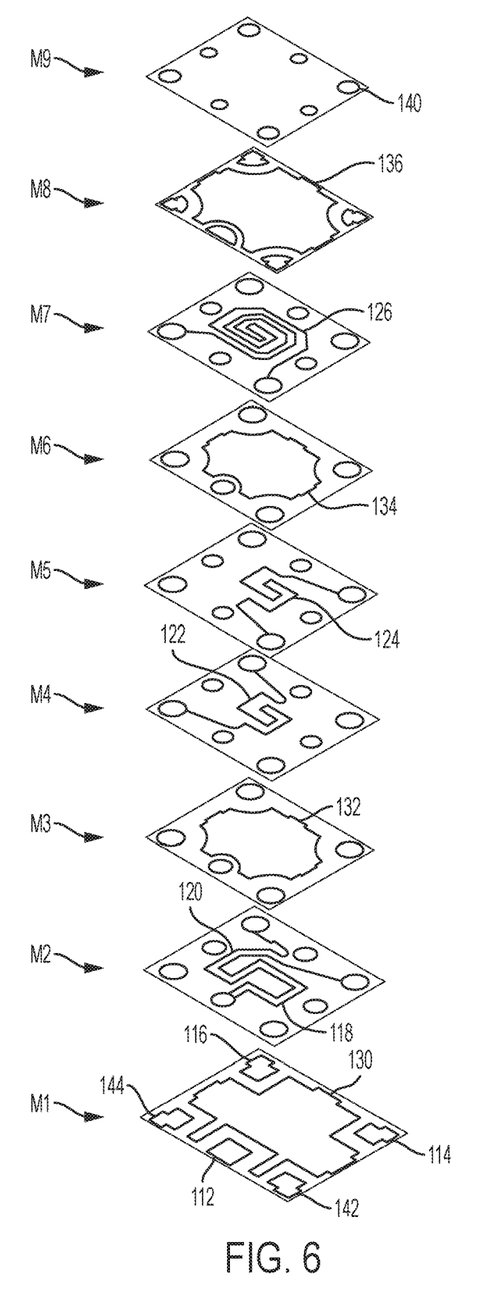
FIG. 6 is a schematic of metallization patterns of a stackup for a surface mount embodiment of a power divider/combiner according to the present invention.

As seen in FIGS. 4A through 4C, two-way power divider 10 can be realized as a surface mount component 100 that is as small as 0.2 inches by 0.25 inches. Surface mount component 100 is preferably implemented in a stackup configuration having eight layers (M1 through M8) as shown in FIG. 5. Metallization patterns for each of the layers M1 through M8 of component 100 are shown in FIG. 6. More specifically, layer M1 has a first pad 112 for first port 12, second and third pads 114 and 116 for second and third ports 14 and 16, respectively, and a metal patch 130 for ground. Additional pads 142 and 144 are provided for connection to resistors, such as R1 and R2, or loads. As this embodiment of the present invention is configured as surface mount component 100, loads are external to the device and two additional pads 142 and 144 are used to connect to the external loads. If the loads are internal, additional pads 142 and 144 may be omitted. Layer M2 includes a vertical input via (In) coupled to input pad 112 and vertical output vias (Out 1) and (Out 2) coupled second and third pads 114 and 116, respectively. A first set of edge coupled lines 118 and 120 extend from input via (In) to each of vertical output vias (Out 1) and (Out 2) to form first set of coupled transmission lines 18 and 20 in FIG. 1. Edge coupled lines 118 and 120 are selected to minimize phase balance and insertion losses. Layer M3 includes an upper ground plane 132 for edge coupled lines 118 and 120 of layer M2. Each of layers M4 and M5 include one of a second set of coupled lines 122 and 124 that form second set of coupled lines 22 and 24 of FIG. 1 and are connected to additional pads 142 and 144 and thus external resistors, such as R1 and R2, or external loads. Second set of coupled lines 122 and 124 are positioned in different layers to form broadside coupled lines to achieve the desired coupling and isolation. Layer M6 includes upper ground plane 134 for broadside coupled lines 122 and 124. Layer M7 includes a long line 126 corresponding to long transmission line 26 in FIG. 1. Long line 36 is shown with a meander structure to accommodate the required 180° line in a stripline format. Layer M8 includes an upper ground plane 136. An additional layer M9 including multiple vias 140 for connection to the various structure of component 100 may be included.

Figure 7:
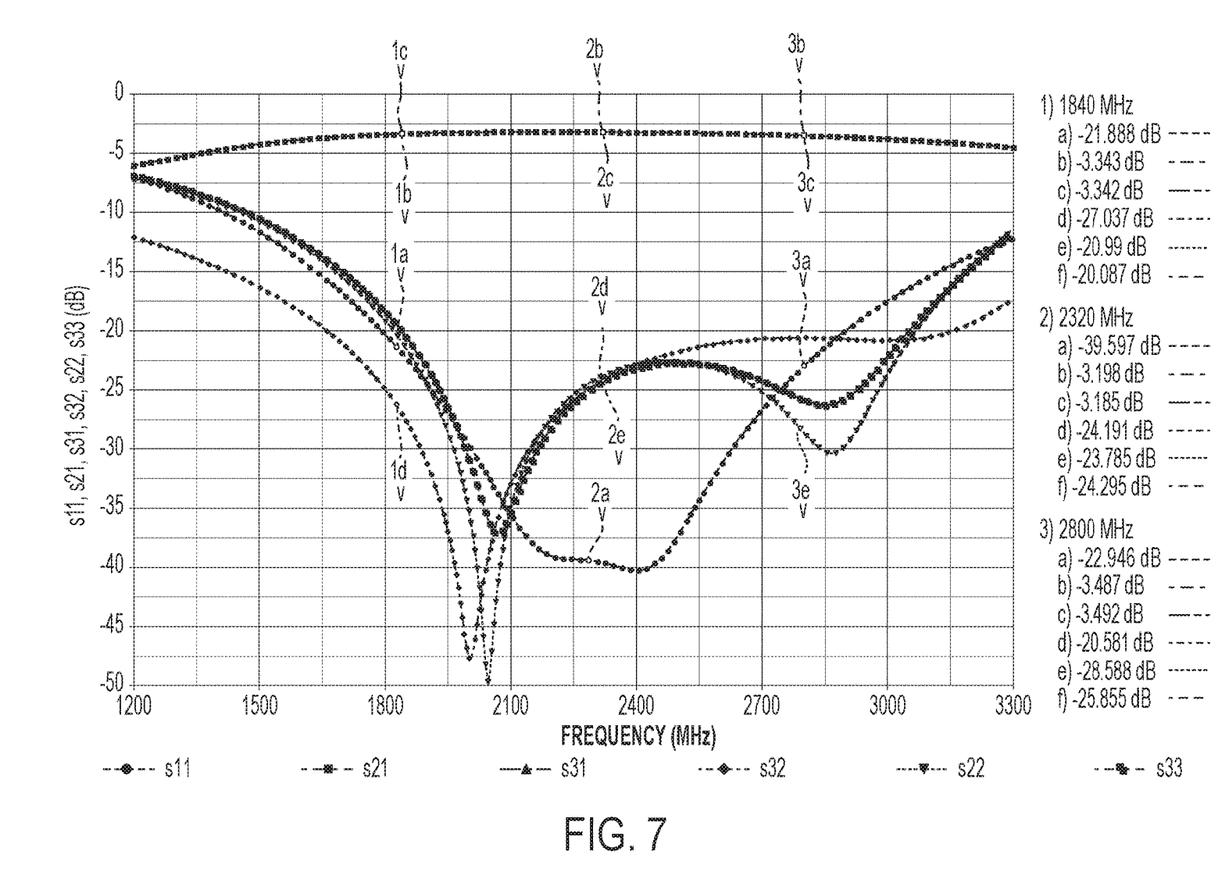
FIG. 7 is a graph of a full 3D simulation result for a power divider/combiner according to the present invention.
Figure 8:
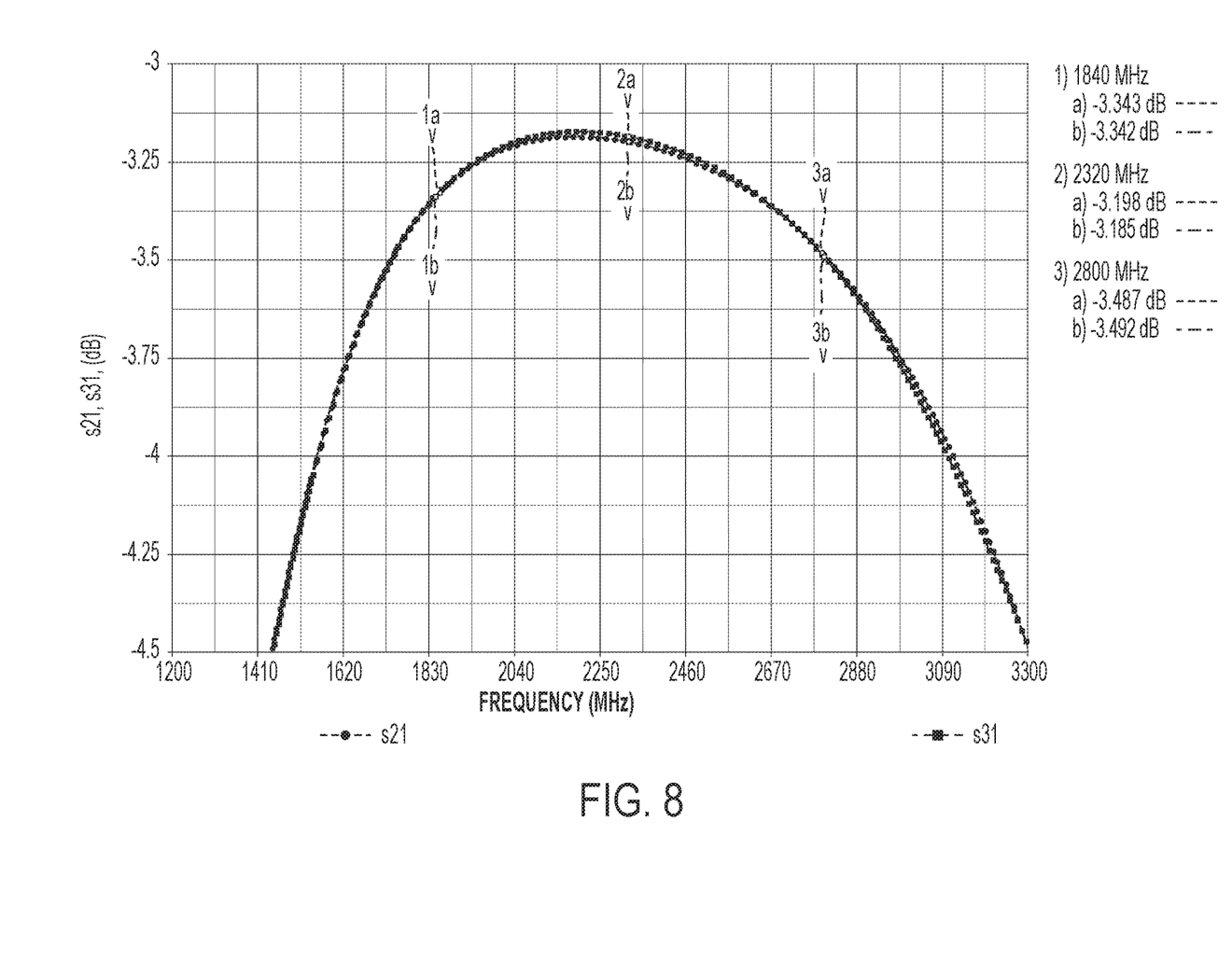
FIG. 8 is a graph of the power division for a power divider/combiner according to the present invention.
Figure 9:
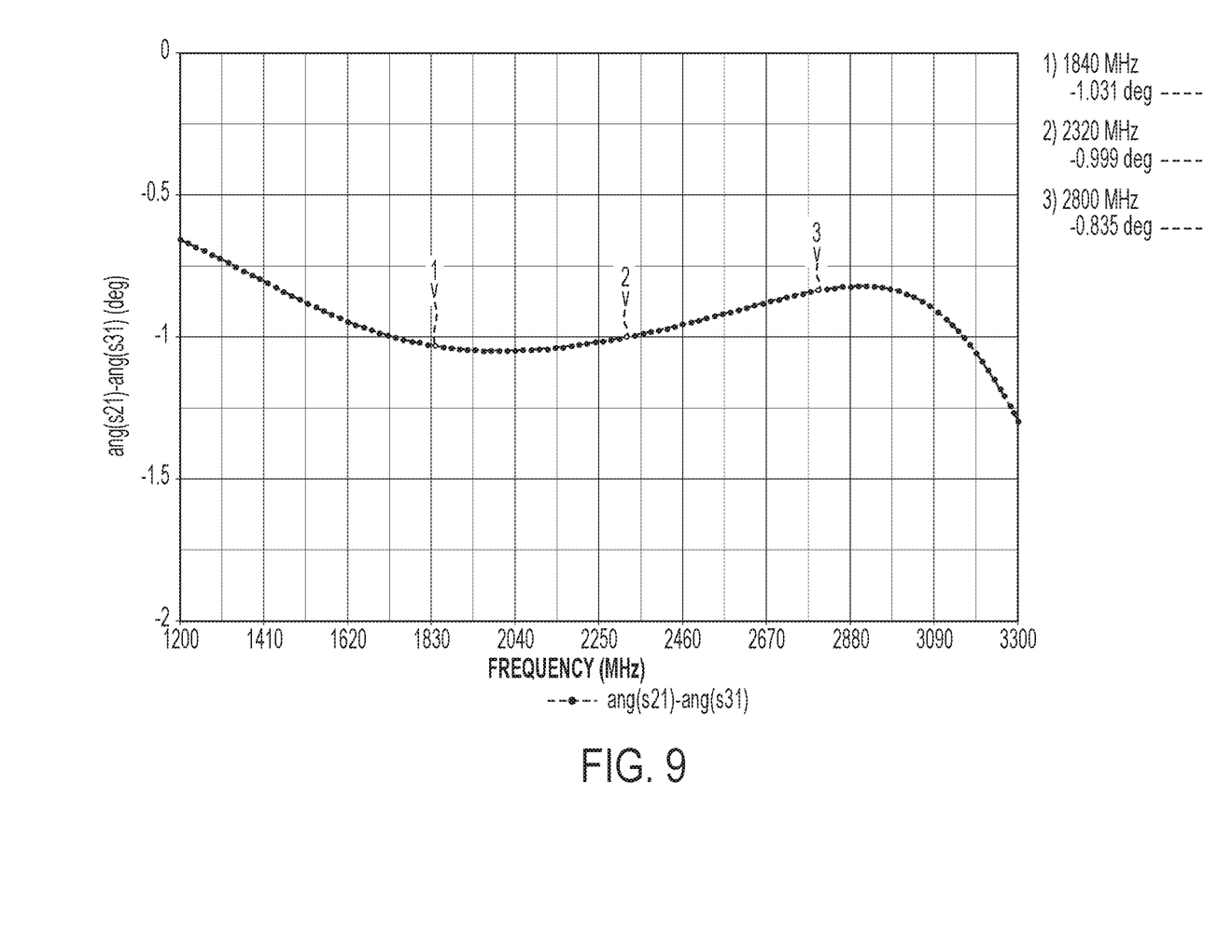
FIG. 9 is a graph of the phase balance at output ports for a power divider/combiner according to the present invention.

As seen in the full 3D simulation of FIG. 7 and the power division graph of FIG. 8, surface mount component 100 has a 41% bandwidth with isolation and return loss better than 20 dB at input and output ports with a center frequency of 2320 MHz. FIG. 9 shows that the phase balance at second and third ports 14 and 16 used as output ports is kept below ±2 degrees.

The bandwidth for the required isolation between second and third ports 14 and 16 is increased due to the combination of coupled lines and conventional transmission lines. No additional sections are required for bandwidth increasing.

The use of coupled lines also allows for a more compact component design that saves space. It should be recognized that the bandwidth can also be improved by varying the value of the isolation resistors R1 and R2, which can be internal or external to surface mount component 100 depending on the design. The layout and stackup of power divider 10 can also vary for different bands as the arrangement of FIG. 6 is merely exemplary. The coupled lines can also be implemented with equivalent combinations of loose and tight coupled small coupling sections, which can further reduce the size, insertion loss and improve isolation.

What is claimed is:

1. A surface mount power divider, comprising:
   a first layer including a first port, a second port, a third port, and a ground patch;
   a second layer including a first via connected to the first port, a second via connected to the second port, and a third via connected to the third port, wherein said second layer further includes a pair of edge coupled lines, wherein one of the pair of edge coupled lines connects the first via to the second via and the other of the edge coupled lines connects the first via to the third via;
   a third layer including a first ground plane associated with the pair of edge coupled lines;
   a fourth layer including one of a pair of broadside coupled lines;
   a fifth layer includes the other of the pair of broadside coupled lines;
   a sixth layer including a second ground plane associated with the pair of broadside coupled lines; and
   a seventh layer including a long line interconnecting the pair of broadside coupled lines.

2. The surface mount power divider of claim 1, wherein the pair of edge coupled lines has even and odd mode impedances.

3. The surface mount power divider of claim 2, wherein the pair of edge coupled lines has an equivalent electrical length of 90 degrees.

4. The surface mount power divider of claim 3, wherein the pair of broadside coupled lines has even and odd mode impedances.

5. The surface mount power divider of claim 4, wherein the pair of broadside coupled lines has an equivalent electrical length of 90 degrees.

6. The surface mount power divider of claim 5, further comprising a fourth port configured for connection to a first external isolation load and a fifth port configured for connection to a second external isolation load.

7. The surface mount power divider of claim 6, wherein the first external isolation load and the second external isolation load have a resistance that is selected to control a bandwidth of the power divider.

8. The surface mount power divider of claim 7, wherein the resistance is 50 Ohm.

9. The surface mount power divider of claim 8, wherein the edge coupled lines and the broadside coupled lines are selected from the group consisting of single transmission lines, multiple transmission lines with tight and loose coupling sections, lumped components, and combinations thereof.

10. A power divider, comprising:
    a first port;
    a first pair of coupled transmission lines interconnected to the first port;
    a second port coupled to one of the first pair of coupled transmission lines;
    a third port coupled to the other of the first pair of coupled transmission lines; and
    a second pair of coupled transmission lines interconnected by a long transmission line, wherein each of the second pair of coupled transmission lines is coupled to one of a pair of grounded isolation resistors, wherein the pair of grounded isolation resistors have a resistance that is selected to control a bandwidth of the power divider, and wherein one of the second pair of coupled transmission lines is connected to the second port and the other of the second pair of coupled transmission lines is connected to the third port.

11. The power divider of claim 10, wherein the first pair of coupled transmission lines has even and odd mode impedances.

12. The power divider of claim 11, wherein the first pair of coupled transmission lines has an equivalent electrical length of 90 degrees.

13. The power divider of claim 12, wherein the second pair of coupled transmission lines has even and odd mode impedances.

14. The power divider of claim 13, wherein the second pair of coupled transmission lines has an equivalent electrical length of 90 degrees.

15. The power divider of claim 14, wherein the long transmission line provides a 180 degree phase shift.

16. The power divider of claim 10, wherein the resistance is 50 Ohm.

17. The power divider of claim 10, wherein the first and second pairs of transmission lines are selected from a group consisting of single transmission lines, multiple transmission lines with tight and loose coupling sections, lumped components, and combinations thereof.

* * * * *